United States Patent
Liu et al.

(10) Patent No.: US 12,090,579 B2
(45) Date of Patent: Sep. 17, 2024

(54) HIGH RELIABILITY LEAD-FREE SOLDER ALLOYS FOR HARSH ENVIRONMENT ELECTRONICS APPLICATIONS

(71) Applicant: INDIUM CORPORATION, Utica, NY (US)

(72) Inventors: Weiping Liu, Utica, NY (US); Ning-Cheng Lee, Utica, NY (US)

(73) Assignee: INDIUM CORPORATION, Clinton, NY (US)

( * ) Notice: Subject to any disclaimer, the term of this patent is extended or adjusted under 35 U.S.C. 154(b) by 0 days.

(21) Appl. No.: 17/856,765

(22) Filed: Jul. 1, 2022

(65) Prior Publication Data

US 2022/0331913 A1    Oct. 20, 2022

Related U.S. Application Data

(60) Continuation of application No. 16/587,705, filed on Sep. 30, 2019, now Pat. No. 11,413,709, which is a
(Continued)

(51) Int. Cl.
*C22C 13/00* (2006.01)
*B23K 35/26* (2006.01)
(Continued)

(52) U.S. Cl.
CPC ............ *B23K 35/262* (2013.01); *C22C 13/00* (2013.01); *C22C 13/02* (2013.01); *H01L 24/11* (2013.01); *H01L 24/13* (2013.01); *H01L 24/16* (2013.01); *H01L 24/29* (2013.01); *H01L 24/81* (2013.01); *H01L 2224/04026* (2013.01); *H01L 2224/05082* (2013.01); *H01L 2224/05155* (2013.01); *H01L 2224/05166* (2013.01);
(Continued)

(58) Field of Classification Search
CPC .............................. B23K 35/262; C22C 13/00
See application file for complete search history.

(56) References Cited

U.S. PATENT DOCUMENTS

| | | | |
|---|---|---|---|
| 5,980,822 A | 11/1999 | Moon et al. | |
| 6,176,947 B1 * | 1/2001 | Hwang | C22C 13/00 420/560 |

(Continued)

FOREIGN PATENT DOCUMENTS

| | | |
|---|---|---|
| CN | 1262159 A | 8/2000 |
| CN | 1346728 | 5/2002 |

(Continued)

OTHER PUBLICATIONS

Second Office Action issued Aug. 29, 2022 for Chinese Application 202110458324X.
(Continued)

*Primary Examiner* — Nicholas A Wang
(74) *Attorney, Agent, or Firm* — Sheppard, Mullin, Richter & Hampton LLP

(57) ABSTRACT

A SnAgCuSbBi-based Pb-free solder alloy is disclosed. The disclosed solder alloy is particularly suitable for, but not limited to, producing solder joints, in the form of solder preforms, solder balls, solder powder, or solder paste (a mixture of solder powder and flux), for harsh environment electronics.

12 Claims, 16 Drawing Sheets

Related U.S. Application Data division of application No. 15/147,137, filed on May 5, 2016, now Pat. No. 11,229,979.

(60) Provisional application No. 62/157,302, filed on May 5, 2015.

(51) Int. Cl.
*C22C 13/02* (2006.01)
*H01L 23/00* (2006.01)

(52) U.S. Cl.
CPC ............... *H01L 2224/05639* (2013.01); *H01L 2224/1131* (2013.01); *H01L 2224/13111* (2013.01); *H01L 2224/16225* (2013.01); *H01L 2224/29111* (2013.01); *H01L 2224/32245* (2013.01); *H01L 2224/81815* (2013.01); *H01L 2224/83815* (2013.01); *H01L 2924/01027* (2013.01); *H01L 2924/01028* (2013.01); *H01L 2924/01029* (2013.01); *H01L 2924/01047* (2013.01); *H01L 2924/01049* (2013.01); *H01L 2924/0105* (2013.01); *H01L 2924/01051* (2013.01); *H01L 2924/01083* (2013.01); *H01L 2924/014* (2013.01)

(56) References Cited

U.S. PATENT DOCUMENTS

| | | | |
|---|---|---|---|
| 6,179,935 | B1 | 1/2001 | Yamashita et al. |
| 2002/0051728 | A1 | 5/2002 | Sato et al. |
| 2006/0263234 | A1 | 11/2006 | Seelig |
| 2007/0036671 | A1 | 2/2007 | Albrecht et al. |
| 2007/0071634 | A1 | 3/2007 | Huwang et al. |
| 2008/0292493 | A1* | 11/2008 | Lee ..................... B23K 35/262 420/560 |
| 2010/0084050 | A1 | 4/2010 | Kraemer et al. |
| 2011/0052444 | A1 | 3/2011 | Hrametz et al. |
| 2012/0018048 | A1 | 1/2012 | Yamashita et al. |
| 2013/0098506 | A1 | 4/2013 | Toyoda et al. |
| 2013/0327444 | A1* | 12/2013 | Sawamura ........... H05K 3/3463 148/24 |
| 2014/0141273 | A1* | 5/2014 | Shimamura ......... B23K 35/262 428/576 |
| 2016/0056570 | A1 | 2/2016 | Yoshikawa et al. |
| 2016/0279741 | A1 | 9/2016 | Ukyo et al. |
| 2017/0014955 | A1 | 1/2017 | Ueshima |

FOREIGN PATENT DOCUMENTS

| | | |
|---|---|---|
| CN | 1398697 | 2/2003 |
| CN | 101456103 A | 6/2009 |
| CN | 101563185 | 10/2009 |
| CN | 101801588 A | 8/2010 |
| CN | 101801589 A | 8/2010 |
| CN | 104507633 A | 4/2015 |
| EP | 1073539 | 2/2001 |
| JP | S 56165588 | 12/1981 |
| JP | 5-50286 A | 3/1993 |
| JP | H1177366 A | 3/1993 |
| JP | H11291083 A | 10/1999 |
| JP | H 11333590 | 12/1999 |
| JP | 2005286274 * | 10/2005 |
| JP | 2008-108993 | 5/2008 |
| JP | 2012081521 A | 4/2012 |
| JP | 2014037005 A | 2/2014 |
| JP | 2014057974 A | 4/2014 |
| JP | 2015-77601 | 4/2015 |
| KR | 10-2009-0059143 | 6/2009 |
| KR | 20130014913 | 2/2013 |
| TW | 201408787 | 3/2014 |
| WO | WO 1997/009455 | 3/1997 |
| WO | WO 2000/048784 | 8/2000 |
| WO | WO0240213 * | 5/2002 |
| WO | WO 2006/122240 | 11/2006 |
| WO | WO 2014/163167 | 10/2014 |

OTHER PUBLICATIONS

Koki Company Ltd., In-free high reliability alloy solder paste SX3A58-M00C, retrieved from htt://www.ko-ki.co.jp/en/products/soder_paste/item_17.html, Apr. 9, 2015, pp. 1-2.
Senju Metal Industry Co., Ltd., Eco Solder, Environment-friendly Lead-Free Solder, Revision date: Jan. 26, 2012 (8 pages).
International Search Report and Written Opinion for International App. No. PCT/US2016/030915, mailed Jul. 5, 2016, Authorized Office: Porrachia, Isabelle.
Office Action issued May 17, 2019 for Taiwan Application No. 105114023, filed May 5, 2016.
Office Action issued Aug. 14, 2019 in Chinese Application No. 201680026365.9.
Office Action issued Aug. 30, 2019 in Taiwan Application No. 105114023.
Office Action dated Dec. 26, 2019 in Taiwan Application No. 105114023.
Examination Report dated Jan. 14, 2020 for European Application No. 16724200.7.
Office Action dated Jan. 14, 2020 for Japanese Application No. 2017-557168.
Office Action issued Mar. 26, 2020 for Chinese Application No. 201680026365.9.
Non-final Office Action issued on Nov. 5, 2018 for U.S. Appl. No. 15/147,137, filed May 5, 2019.
Final Office Action issued on Mar. 13, 2019 for U.S. Appl. No. 15/147,137, filed May 5, 2019.
Non-final Office Action issued on Nov. 20, 2019 for U.S. Appl. No. 15/147,137, filed May 5, 2019.
Final Office Action issued on Apr. 21, 2020 for U.S. Appl. No. 15/147,137, filed May 5, 2019.
Third Office Action dated Sep. 15, 2020 for Chinese Application No. 201680026365.9.
Schwartz et al., "Fundamentals of Soldering," Welding, Brazing and Soldering, vol. 6, ASM Handbook, Editied by David LeRoy Olson, Thomas A. Sieward, Stephen Liu, Glen R. Edwards, ASM International (1993), pp. 126-137, https://doi.org/10.31399/asm.hb.v06.a0001346.
Non-final Office Action dated Oct. 8, 2020 for U.S. Appl. No. 15/147,137, filed May 5, 2015.
Examination Report mailed Jan. 19, 2021 for Malaysian Application No. PI 2017704102, filed May 5, 2016.
Extended European Search Report dated Apr. 20, 2021 for European Application No. EP 21156332.5.
Final Office Action mailed May 27, 2021 for U.S. Appl. No. 15/147,137, filed May 5, 2016.
Korean Office Action dated Aug. 21, 2021 for Korean Application No. 10-2017-7033626.
Office Action dated Oct. 21, 2021 for Taiwan Application No. 110110035.
Notice of Final Rejection dated Dec. 20, 2021 for Korean Application No. 10-2017-7033626.
Korean Office Action dated Feb. 23, 2022 for Korean Application No. 10-2017-7033626.
Chinese First Office Action issued Mar. 8, 2022 for Chinese Application No. 202110458324X.
Notification of Preliminary Rejection mailed Mar. 19, 2023 for Korean Application No. 10-2022-7032815.
Notification of the Decision of Rejection issued Mar. 1, 2023 for Chinese Application No. 202110458324.X.
Office Action dated Sep. 25, 2023 for Korean Application No. 10-2022-7032815.
Examination Report—Communication pursuant to Article 94(3) EPC for European Application No. 21156332.5.

* cited by examiner

| Alloy No. | Designation | Sn | Ag | Cu | Sb | Bi | Ni | Co | Pb | Solidus, °C | Liquidus, °C |
|---|---|---|---|---|---|---|---|---|---|---|---|
| 1 | SB3503 | Bal. | 3.80 | 1.10 | 3.46 | 0.38 | | | | 219.9 | 226.0 |
| 2 | SB3503NiCo | Bal. | 3.54 | 1.04 | 3.46 | 0.29 | 0.05 | 0.05 | | 218.8 | 226.0 |
| 3 | SB5503 | Bal. | 3.98 | 1.10 | 5.63 | 0.30 | | | | 222.0 | 228.7 |
| 4 | 3820SB | Bal. | 3.65 | 1.93 | 3.30 | 0.36 | | | | 219.3 | 226.1 |
| 5 | SB3520 | Bal. | 3.71 | 1.04 | 3.35 | 1.97 | | | | 215.6 | 223.7 |
| 6 | Indalloy151 | 5.39 | 2.35 | | | | | | Bal. | 298.0 | 304.1 |

FIG. 1

| Alloy No. | Designation | Sn | Ag | Cu | Sb | Bi | In | Ni | Solidus, °C | Liquidus, °C |
|---|---|---|---|---|---|---|---|---|---|---|
| 7 | SB6003 | Bal. | 3.96 | 0.97 | 6.20 | 0.29 | | | 222.6 | 229.0 |
| 8 | 2810SB | Bal. | 2.71 | 1.04 | 5.91 | 0.32 | | | 221.1 | 230.9 |
| 9 | SB3515 | Bal. | 3.84 | 1.21 | 3.71 | 1.54 | | | 216.3 | 226.6 |
| 10 | SN60 | Bal. | 3.85 | 0.69 | 6.40 | | | | 223.1 | 231.5 |
| 11 | Sb3.5 | Bal. | 3.84 | 0.98 | 3.72 | | | 0.08 | 221.8 | 226.6 |
| 12 | Sb5.5 | Bal. | 3.85 | 0.94 | 5.70 | | | | 223.3 | 228.3 |
| 13 | Sb8.0 | Bal. | 3.26 | 0.74 | 8.18 | | | | 223.3 | 231.7 |
| 14 | SI6005 | Bal. | 3.86 | 0.96 | 6.28 | | 0.45 | | 221.6 | 228.4 |
| 15 | SI6030 | Bal. | 3.80 | 0.89 | 6.19 | | 3.12 | | 216.9 | 225.2 |
| 16 | SI3025 | Bal. | 3.81 | 0.58 | 2.92 | | 2.44 | | 212.7 | 221.6 |
| 17 | SI3505 | Bal. | 3.28 | 0.71 | 3.55 | | 0.70 | | 219.5 | 226.5 |
| 18 | SI3520 | Bal. | 3.34 | 0.71 | 3.60 | | 2.08 | | 215.2 | 224.1 |
| 19 | SI3540 | Bal. | 3.24 | 0.70 | 3.64 | | 4.20 | | 208.0 | 221.1 |
| 20 | SI3520Bi | Bal. | 3.26 | 0.74 | 3.55 | 0.45 | 2.22 | | 214.1 | 223.2 |
| 21 | SI3520Ni | Bal. | 3.20 | 0.68 | 3.45 | | 2.06 | 0.05 | 214.2 | 225.2 |
| 22 | Innolot | Bal. | 3.80 | 0.70 | 1.50 | 3.00 | | 0.15 | 211.2 | 221.2 |

FIG. 2

Alloy No. 1

Alloy No. 2

Alloy No. 3

Alloy No. 4

Alloy No. 5

Alloy No. 6

HIGH RELIABILITY LEAD-FREE SOLDER ALLOYS FOR HARSH ENVIRONMENT ELECTRONICS APPLICATIONS

CROSS-REFERENCE TO RELATED APPLICATIONS

This application is a continuation of and claims priority to U.S. patent application Ser. No. 16/587,705 filed Sep. 30, 2019, titled "HIGH RELIABILITY LEAD-FREE SOLDER ALLOYS FOR HARSH ENVIRONMENT ELECTRONICS APPLICATIONS", which is a divisional of and claims priority to U.S. patent application Ser. No. 15/147,137 filed May 5, 2016, titled "HIGH RELIABILITY LEAD-FREE SOLDER ALLOYS FOR HARSH ENVIRONMENT ELECTRONICS APPLICATIONS", and issued as U.S. Pat. No. 11,229,979 on Jan. 25, 2022, which claims priority to U.S. Provisional Application No. 62/157,302 filed May 5, 2015, titled "High Reliability Lead-Free Solder Alloys for Harsh Environment Electronics Applications". The entire contents of all of the above applications are incorporated herein by reference in their entirety.

TECHNICAL FIELD

The present disclosure relates generally to lead-free solder alloy compositions for use in electronics and, in particular, to lead-free solder preforms, solder powder, solder balls, solder pastes, and solder joints made of a lead-free solder alloy.

DESCRIPTION OF THE RELATED ART

Since the European Union implemented Restrictions on Hazardous Substances (RoHS) regulations in July 2006, lead (Pb) free solder alloys have been widely adopted by electronics industries. However, current Pb-free solder alloys are mainly used in non-harsh electronics environments that require a service or operating temperature at or below 125° C. For harsh electronics environments, such as for, for example, automotive applications that require operating temperatures at 150° C. or higher, the Pb-free SnAgCu ("SAC") solders such as Sn3.0Ag0.5Cu (SAC305) and Sn3.8Ag0.7Cu (SAC387) alloys are not reliable enough to replace the high-Pb, high melting temperature solders.

High-Pb solder alloys are currently one of the most widely used die attach materials in power semiconductor packages, especially in large-sized dies. The microstructures of the high-Pb solders are generally quite stable and they do not change much during long-term aging at elevated temperatures. These high-melting, high-Pb alloys, which combine the high-temperature capability and stability with high ductility and acceptable thermal/electrical conductivity for most applications, are widely used in a range of applications including the packaging of high power modules.

Harsh environment electronic industries that are currently exempted from RoHS regulations are actively searching for a suitable replacement solder. In addition to Pb-free legislation, this search is driven by more stringent electronics reliability requirements due to the increasing utilization of electronics in automotive vehicles. The automotive industry's trend toward higher power electrical vehicles requires that the power modules in the vehicles (e.g., the IGBT module) have a higher efficiency, lighter weight, smaller size, and higher reliability at high operating temperatures. This in turn drives demand for the use of Pb-free solder alloys with a reliability even higher than that of current high-Pb solders. In some semiconductor packaging applications, it is also intended to reduce the soldering process temperatures to those of the popular SAC alloys since there are no subsequent soldering assembly requirements.

In view of the forgoing, it would be desirable to develop a high reliability Pb-free solder alloy to meet the requirements for these harsh environment electronics applications such as in the automotive and defense industries.

BRIEF SUMMARY OF EMBODIMENTS

A SnAgCuSb-based Pb-free solder alloy is disclosed. The disclosed solder alloy is particularly suitable for, but not limited to, producing solder joints, in the form of solder preforms, solder balls, solder powder, or solder paste (a mixture of solder powder and flux), for harsh environment electronics. An additive selected from 0.1-2.5 wt. % of Bi and/or 0.1-4.5 wt. % of In may be included in the solder alloy.

As used herein, the term "about" in quantitative terms refers to plus or minus 10%. For example, "about 10" would encompass 9-11. Moreover, where "about" is used herein in conjunction with a quantitative term it is understood that in addition to the value plus or minus 10%, the exact value of the quantitative term is also contemplated and described. For example, the term "about 10" expressly contemplates, describes and includes exactly 10.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 1 is a table listing SnAgCuSbBi-system embodiments of a solder alloy in accordance with the disclosure (Alloy Nos. 1-5) and a comparative industry standard high-Pb solder alloy (Alloy No. 6).

FIG. 2 is a table listing embodiments of a solder alloy in accordance with the disclosure (Alloy Nos. 7-21), and a comparative Pb-free commercial alloy Sn3.8Ag0.7Cu3.0Bi1.4Sb0.15Ni (Alloy No. 22—Innolot).

Figure 3:
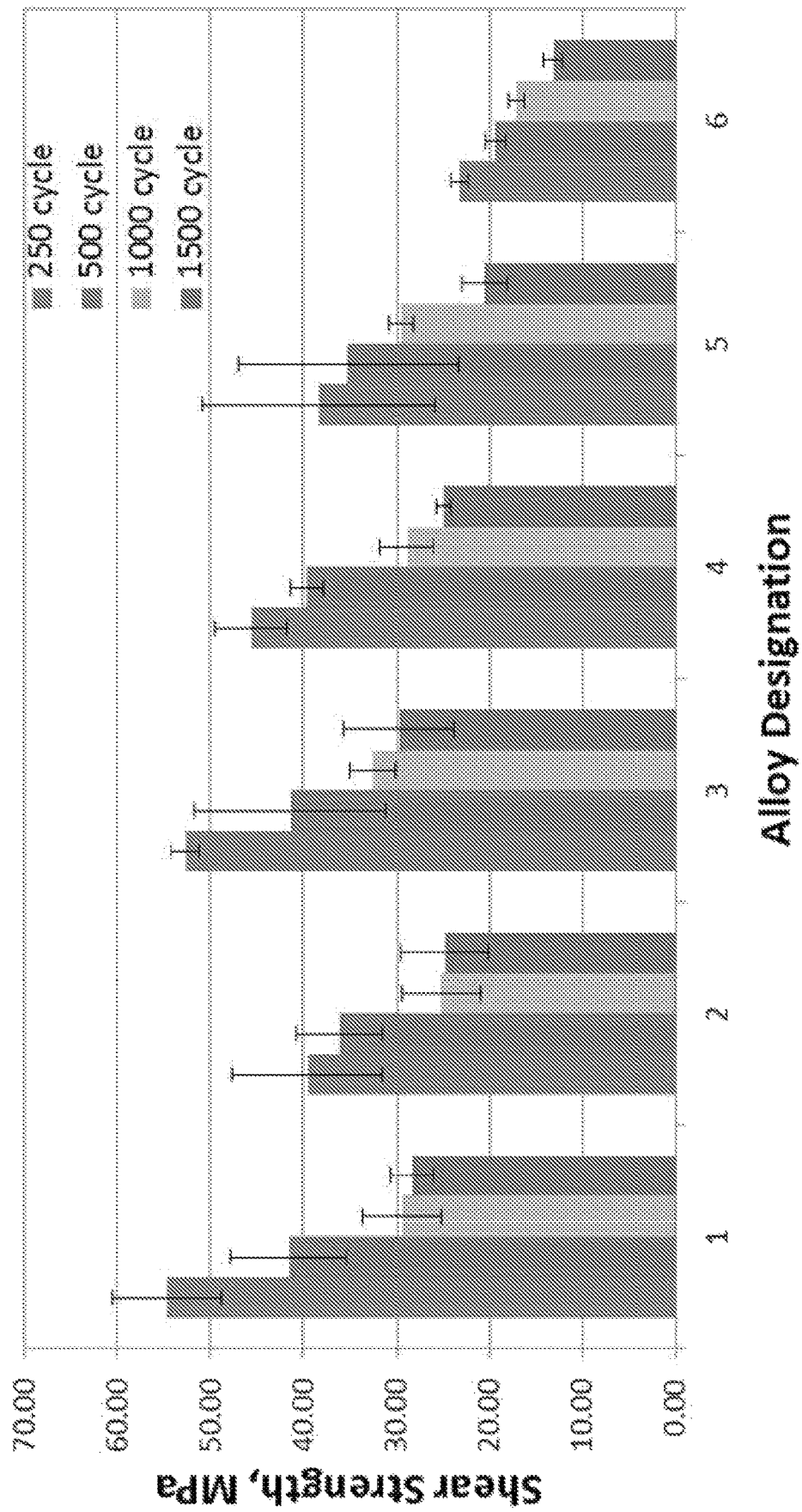
FIG. 3 illustrates the average solder joint shear strengths after 250, 500, 1000, and 1500 thermal shock cycles for solder joints comprising tested Alloy Nos. 1-6 of FIG. 1.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

In accordance with various embodiments of the disclosed technology, a SnAgCuSb-based Pb-free solder alloy and solder joints comprising the solder alloy are disclosed. The disclosed solder alloy is particularly suitable for, but not limited to, producing solder joints, in the form of solder preforms, solder balls, solder powder, or solder paste (a mixture of solder powder and flux), for harsh environment electronics applications that require high reliability at higher service or operation temperatures such as 150° C. or higher.

In various embodiments, the solder alloy comprises 2.5-4.5 wt. % of Ag, 0.6-2.0 wt. % of Cu, 2.5-9.0 wt. % of Sb, and the remainder of Sn. In further embodiments, the solder alloy may additionally include at least one of the following additives selected from (a) 0.1-2.5 wt. % of Bi, (b) 0.1-4.5 wt. % of In, and (c) 0.001-0.2 wt. % of Ni, or Co, or both.

In a first set of embodiments, the solder alloy is a SnAgCuSbBi-system alloy comprising 2.5-4.5 wt. % of Ag, 0.6-2.0 wt. % of Cu, 2.5-9.0 wt. % of Sb, 0.1-2.5 wt. % of Bi, and a remainder of Sn. In particular implementations of these embodiments, the solder alloy consists essentially of 3.0-4.0 wt. % of Ag, 0.6-1.2 wt. % of Cu, 5.0-6.0 wt. % of Sb, about 0.3 wt. % of Bi, and the remainder of Sn. For example, the solder alloy may consist essentially of about 3.8 wt. % of Ag, about 1.0 wt. % of Cu, about 6.0 wt. % of Sb, about 0.3 wt. % of Bi, and the remainder of Sn.

In a second set of embodiments, the solder alloy is a SnAgCuSb-system alloy consisting essentially of 3.0-4.0 wt. % of Ag, 0.6-1.2 wt. % of Cu, 3.0-9.0 wt. % of Sb, and the remainder of Sn. In particular implementations of these embodiments, the Sb content may be 5.0-6.0 wt. %.

In a third set of embodiments, the solder alloy is a SnAgCuSbIn(Bi)-system alloy comprising: 2.5-4.5 wt. % of Ag, 0.6-2.0 wt. % of Cu, 2.5-9.0 wt. % of Sb, 0.1-4.5 wt. % of In, and the remainder of Sn. In one set of implementations of these embodiments, the solder alloy consists essentially of 3.0-4.0 wt. % of Ag, 0.6-1.2 wt. % of Cu, 3.0-5.0 wt. % of Sb, 1.0-4.0 wt. % of In, about 0.5 wt. % of Bi, and the remainder of Sn. In another set of implementations of these embodiments, the solder alloy consists essentially of 3.0-4.0 wt. % of Ag, 0.6-1.2 wt. % of Cu, 5.0-6.0 wt. % of Sb, about 0.5 wt. % of In, and the remainder of Sn.

As illustrated by the experimental results, summarized below, solder joints made of embodiments of the Pb-free solder alloys disclosed herein have a greater thermal fatigue resistance at thermal cycling and thermal shock testing compared to those made of the industry standard high-Pb solder alloy (Pb5Sn2.5Ag). Additionally, solder joints made of embodiments of the Pb-free solder alloys disclosed herein substantially outperformed a standard Pb-free commercial alloy Sn3.8Ag0.7Cu3.0Bi1.4Sb0.15Ni (Innolot) in thermal fatigue resistance, in shear strength tests under a variety of conditions especially after thermal cycling tests.

EXAMPLES

The chemical compositions of various embodiments of the disclosed SnAgCuSb-based Pb-free solder alloy (alloy nos. 1-5 and 7-21), an industry standard high-Pb solder alloy (alloy no. 6), and a Pb-free commercial alloy Sn3.8Ag0.7Cu3.0Bi1.4Sb0.15Ni (Innolot, alloy no. 22) were measured with Inductively Coupled Plasma (ICP) analysis, as shown in FIGS. 1 and 2, which list chemical compositions by wt %. The melting behavior of the solder alloys was analyzed using Differential Scanning Calorimetry (DSC) with a heating and cooling rate of 10° C./min. DSC tests were performed in a TA Q2000 differential scanning calorimeter, scanning from room temperature to 350° C. For each alloy, the sample was first scanned from ambient temperature up to 350° C., followed by cooling down to 20° C., then scanned again up to 350° C. The second heating thermograph was used to represent the melting behavior of alloys. The solidus and liquidus temperatures of solder alloys obtained from the DSC analyses are listed in the tables in FIGS. 1 and 2.

SnAgCuSbBi-System Alloy Examples

Thermal fatigue resistance of solder joints comprising embodiments of SnAgCuSbBi-system solder alloys, shown in FIG. 1, was evaluated using thermal shock testing. The thermal shock testing was conducted using the following procedure. Two types of Si die metallized with Ti/Ni/Ag films, with dimensions of 8×8×0.25 mm and 3×3×0.7 mm, respectively, were soldered to a lead frame substrate of pure Ni coated Cu to form die-attach solder joints. Solder preforms were used, with dimensions of 8×8×0.15 mm and 3×3×0.15 mm, respectively. Soldering was conducted by assembling the set of Si die/solder preform/substrate with a jig to facilitate the positioning and coplanarity of the assembly, followed by heating in a reflow oven with a peak temperature of 246° C. and time above 220° C. of 61 seconds for the Pb-free experimental solder alloys, or with a peak temperature of 335° C. and TAL (time above liquidus) of 61 seconds for the standard high-Pb solder alloy (Pb5Sn2.5Ag).

The resulting die-attach solder joints were placed into an air-to-air thermal shock tester, where two separate chambers were set to opposite temperature extremes, respectively, and a mechanism moved the tested samples between the two chambers and maintained at each temperature extreme for a specific time (dwell time). Thermal shock tests were carried out in the present experiments under −40° C./150° C. with a dwell time of 20 minutes for a maximum of 1500 cycles. At cycle numbers of 250, 500, 1000, and 1500, a set of samples were taken out from each of the 3×3 mm and 8×8 mm type die-attach solder joint samples for various testing and measurement purposes. The 3×3 mm type die-attach joints were shear tested using a Condor 250 XYZTEC die shear tester at a shear speed of 6 mm per minute, and the remaining shear strengths after various thermal shock cycles for each alloy were measured in MPa. The 8×8 mm type die-attach joints were used for cracking detection by C-SAM imaging analyses and for crack length measurements by cross-sectioning and microscopy observations.

FIG. 3 illustrates the average solder joint shear strengths after 250, 500, 1000, and 1500 thermal shock cycles for solder joints comprising tested alloys No. 1-6 of FIG. 1. The higher the remaining strength of a solder joint after thermal shock tests, the more reliable it is. As shown, the shear strength of solder joints decreases with increasing thermal shock cycles due to increased damage in the solder joints caused by thermal shock cycling tests. The decrease rate of the shear strengths is generally reduced with the increasing thermal shock cycles.

As illustrated, under all test conditions, solder joints including SnAgCuSbBi embodiments of the disclosed solder alloy (Alloy Nos. 1-5) exhibited higher shear strengths than a solder joint including the industry standard high-Pb solder alloy (Alloy No. 6). Alloy No. 3 showed shear strengths that doubled those of the high-Pb solder joints under all test conditions.

Figure 4:
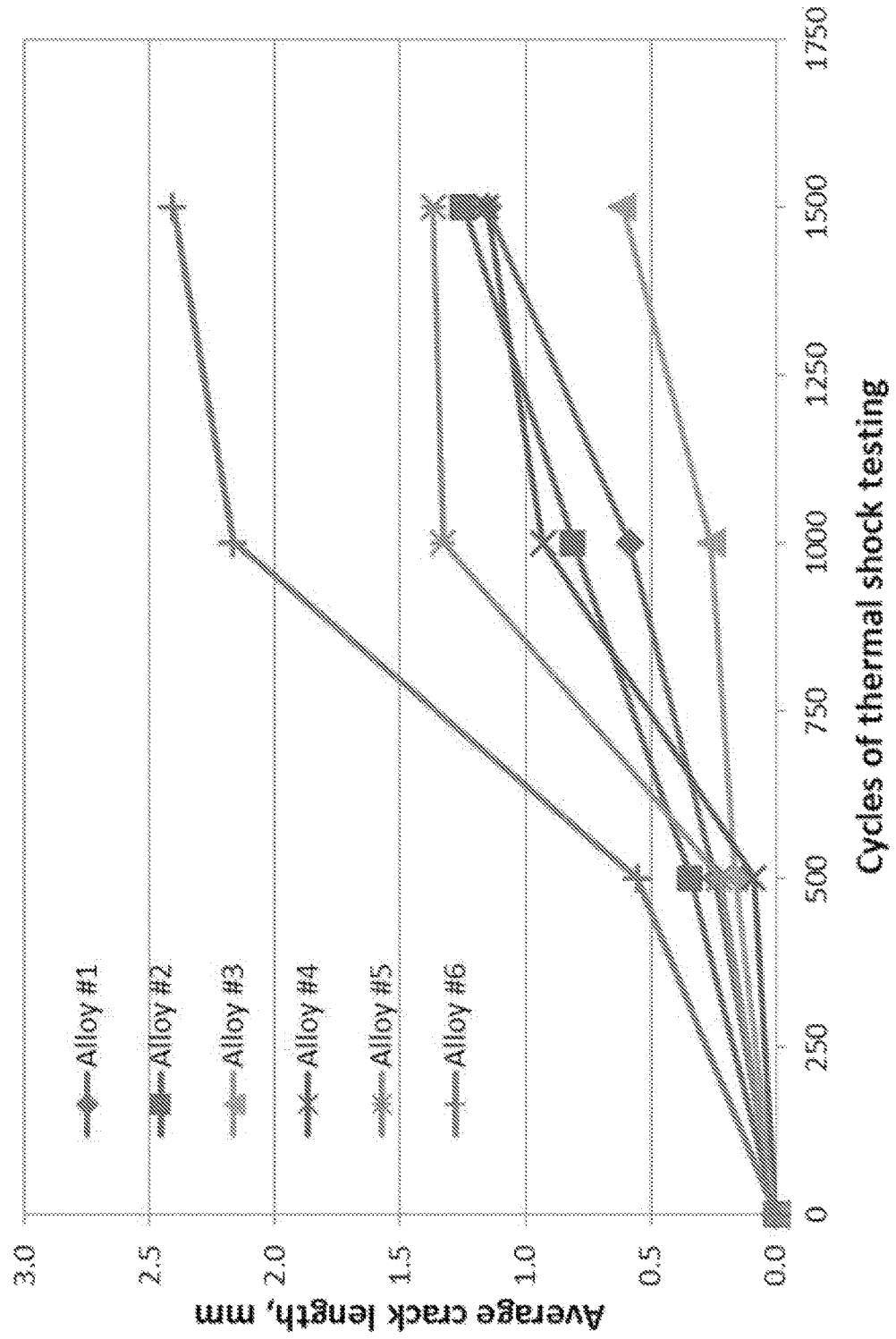
FIG. 4 illustrates the average crack lengths in solder joints measured after thermal shock cycles of 500, 1000, and 1500 for solder joints comprising tested Alloy Nos. 1-6 of FIG. 1.

FIG. 4 illustrates the average crack lengths in solder joints measured after thermal shock cycles of 500, 1000, and 1500 for solder joints comprising tested alloys No. 1-6 of FIG. 1. The average crack length increases with the increase in number of cycles. The slower the crack propagates in a solder joint, the more resistant it is to thermal fatigue failure. Solder joints including SnAgCuSbBi-system embodiments of the disclosed solder alloy (Alloy Nos. 1-5) had substantially shorter average crack lengths than a solder joint including the industry standard high-Pb solder alloy (Alloy No. 6).

Figure 5:
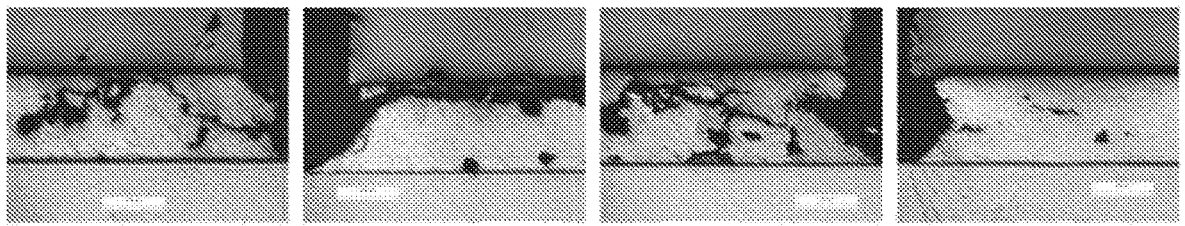
FIG. 5 shows a set of optical micrographs at the ends of cross-sectional solder joints for solder joints comprising tested Alloy Nos. 1-6 after TS testing of 1000 cycles.
Figure 5:
Figure 5:
Figure 5:
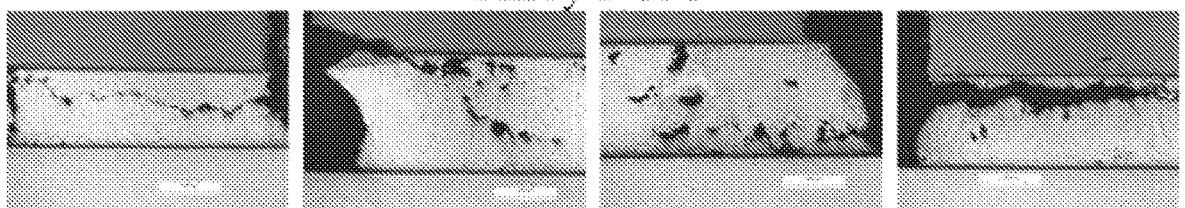
Figure 5:
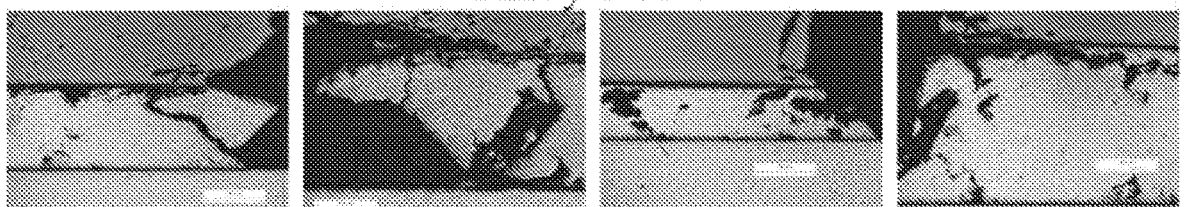
Figure 5:
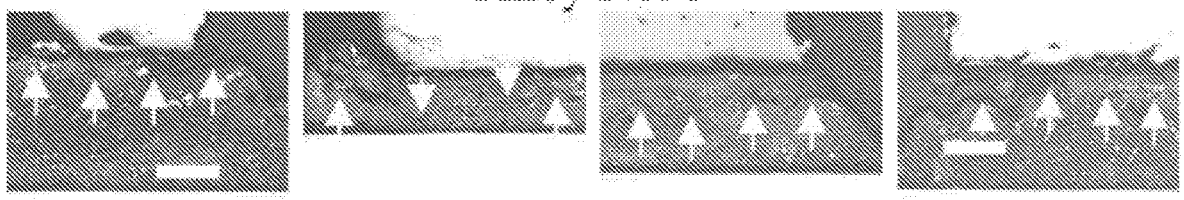
Figure 6:
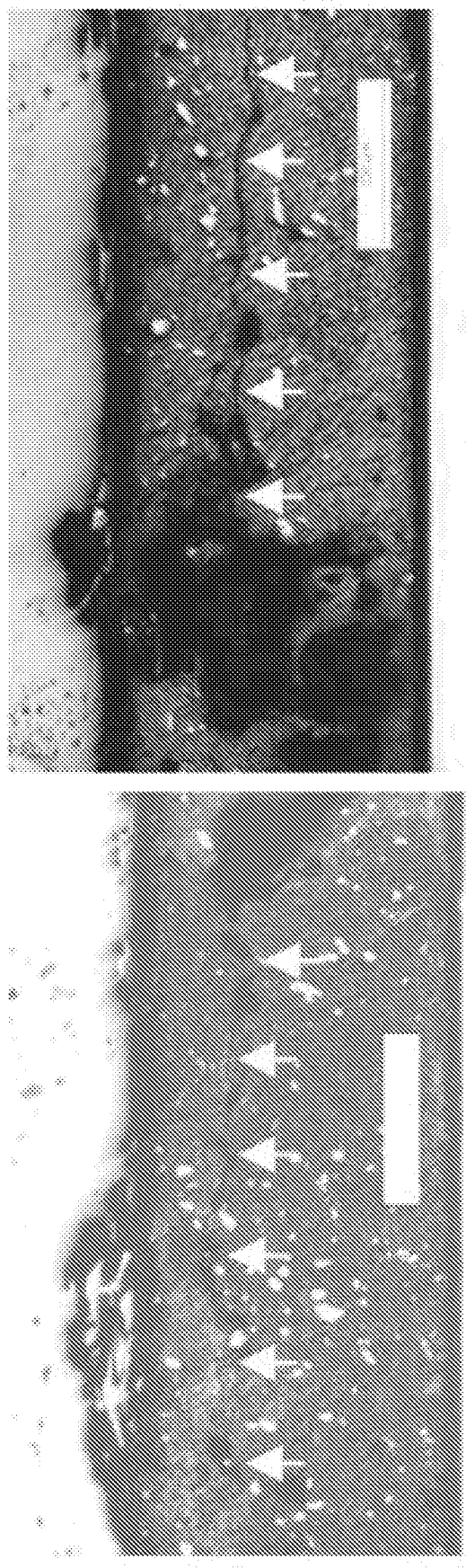
FIG. 6 shows optical micrographs including a close-up view of the cross-sections for a high-PB solder joint after TS testing of 1000 cycles.

FIG. 5 shows a set of optical micrographs at the ends of cross-sectional solder joints for solder joints comprising tested alloys No. 1-6 after TS testing of 1000 cycles. The cross-section observations of cracks illustrate the longer crack length of solder joints formed using the high-Pb solder alloy (Alloy No. 6). For Alloy No. 6, cracks are observed to propagate from the edge through the whole view field of each picture (as marked by the white arrows). These cracks in the high-Pb solder joints extended well into the inside of the joints away from both ends, as shown in FIG. 6.

Figure 7:
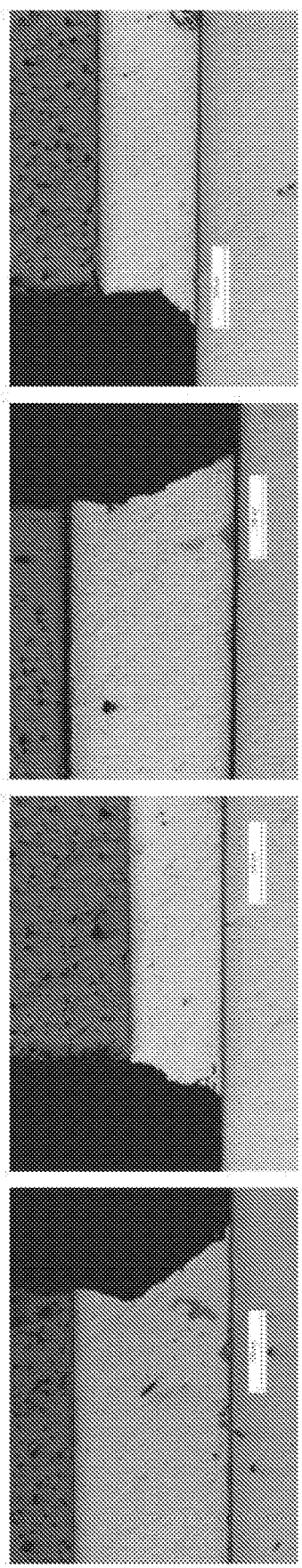
FIG. 7 shows a set of cross-sectional micrographs of solder joints for Alloy No. 3 and Alloy No. 6 of FIG. 1 after thermal shock testing of 250 cycles.
Figure 7:
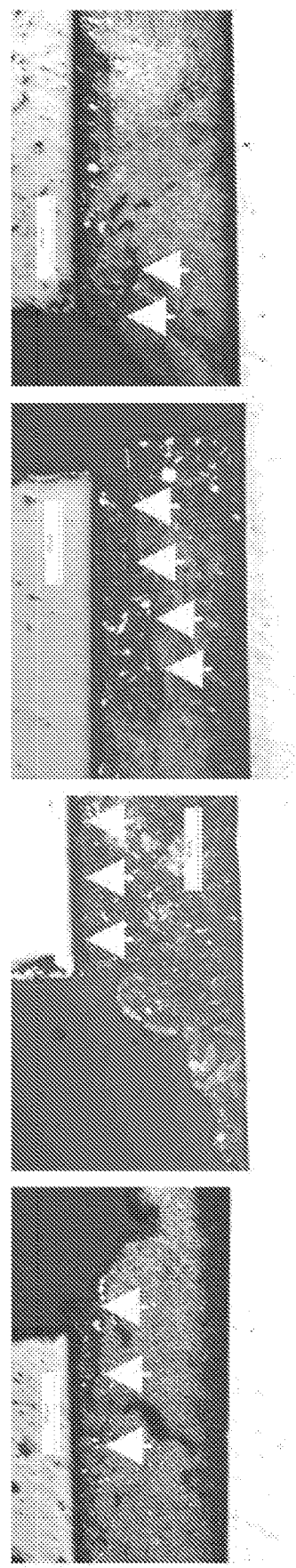

FIG. 7 shows a set of cross-sectional micrographs of solder joints for Alloy No. 3 and Alloy No. 6 after thermal shock testing of 250 cycles. As demonstrated by FIG. 7, for the Pb-free alloys the thermal fatigue cracks generally initiated after 250 cycles of TS testing, whereas for the high-Pb alloy the cracks initiated before 250 cycles.

SnAgCuSb and SnAgCuSbIn(Bi) System Alloy Examples

Following the good reliability performance of the designed solder alloys in the SnAgCuSbBi system (FIG. 1), alloys in the SnAgCuSb and SnAgCuSbIn(Bi) systems (Alloys No. 11-21), as shown in FIG. 2, were tested.

Figure 8:
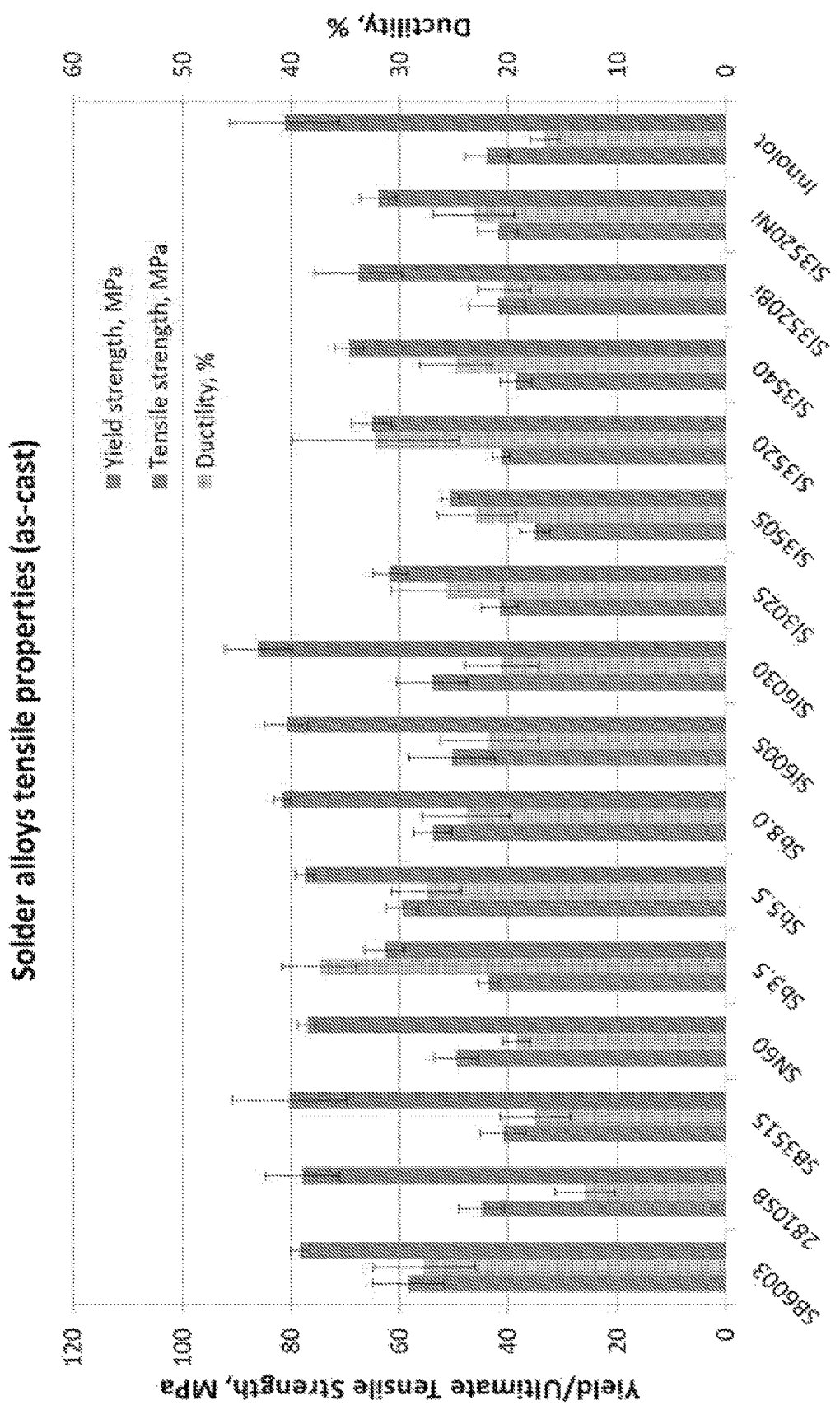
FIG. 8 shows the experimental results of yield strength, ultimate tensile strength, and ductility of as-cast solder alloys listed in FIG. 2.
Figure 9:
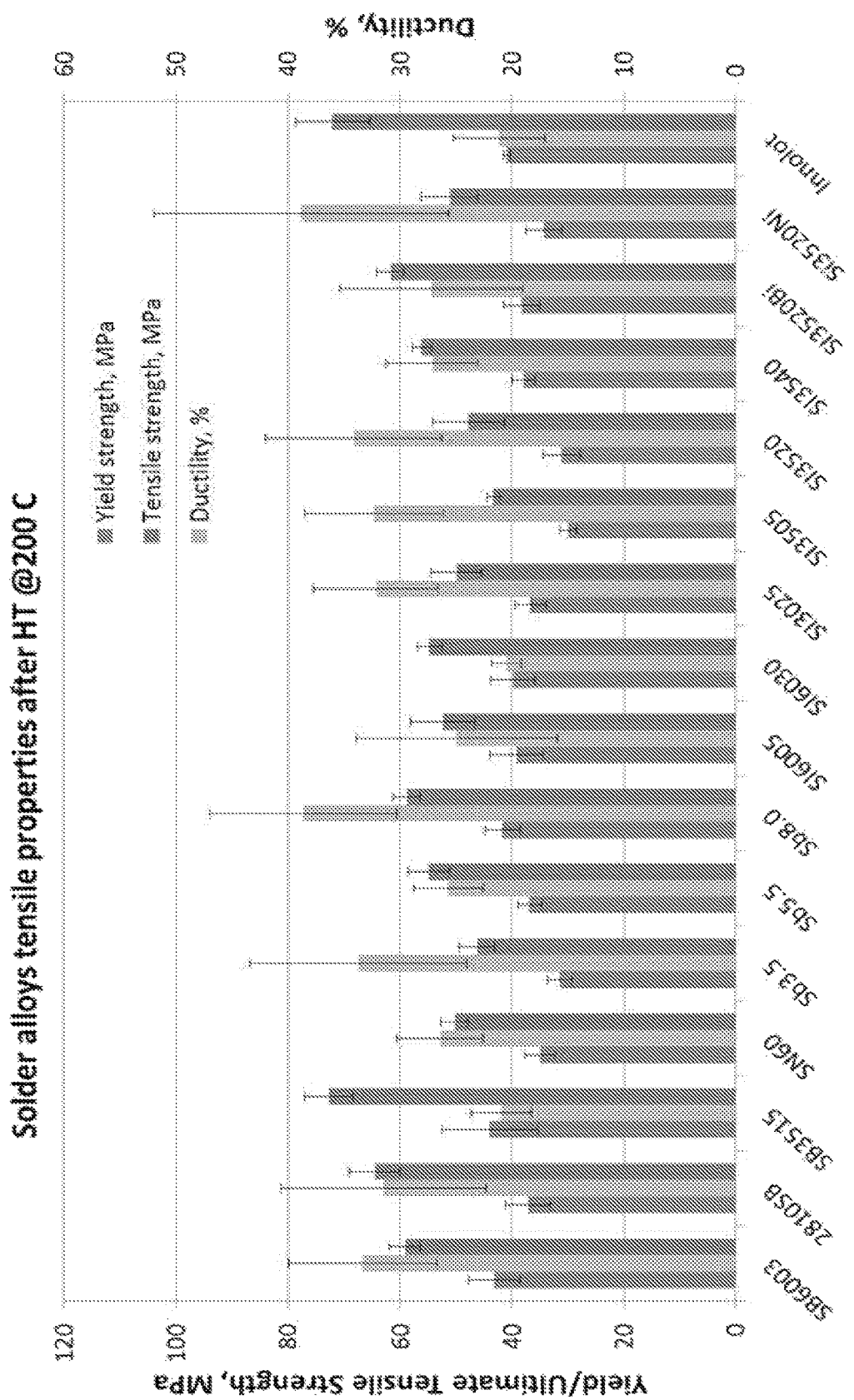
FIG. 9 shows the experimental results of yield strength, ultimate tensile strength, and ductility of the solder alloys listed in FIG. 2 after a thermal aging treatment at 200° C. for 1000 hours.

Tensile tests were conducted in accordance with standard ASTM testing procedure to evaluate the mechanical properties of the solder alloys. Round test specimens with a diameter of ¼" and gauge length of 1" and a testing speed of 0.05 inch per minute were used in the tensile tests. FIG. 8 shows the results of yield strength, ultimate tensile strength, and ductility of as-cast solder alloys listed in FIG. 2. In FIG. 2, alloys No. 7-21 are solder alloys according to the present disclosure, and alloy No. 22 is a commercial high-reliability Pb-free alloy used as a comparative alloy. FIG. 9 shows the results of yield strength, ultimate tensile strength, and ductility of the solder alloys listed in FIG. 2 after a thermal aging treatment at 200° C. for 1000 hours.

Solder pastes were made by mixing the Type 4 (38-20 microns in particle sizes) solder alloy powder (with a metal load of 88.25%) with a no-clean flux following a standard paste making procedure. Die-attach solder joints, assembled with a solder paste on either a pure Cu or a pure Ni substrate, were used for evaluation in the subsequent reliability tests. The Cu substrates were cleaned with a 10% $HBF_4$ acid solution, then rinsed with DI water. The pure Ni substrates were cleaned with a nitric acid pickling solution (14% $HNO_3$ in water), then rinsed with DI water. First, Si dies metallized with Ti/Ni/Ag films (75 nm Ti/300 nm Ni/75 nm Ag), with sizes of 3×3×0.7 mm, were used for the solder joints assembly. The solder paste was printed onto the substrate using a stencil of 8 mils (0.2 mm) thickness with 3×3 mm openings, and then the die was placed onto the printed solder paste. However, for the Si die-attach solder joints, the solder joint shear strength cannot be measured under the as-reflowed conditions because in die shear testing of the as-reflowed joints the fracture occurs completely in the Si die. To obtain the as-reflowed solder joints shear strength, Invar dies with sizes of 3×3×1.0 mm were used to make the metal die-attach solder joints. Invar is the 64Fe36Ni alloy, known for its uniquely low coefficient of thermal expansion (CTE). Invar has a CTE of about 1.2 ppm/° C., about half the value compared to a CTE of about 2.6 ppm/° C. for Si. Thus, the Invar die-attach solder joints have a much higher CTE mismatch, and are expected to have a shorter lifetime than the Si die-attach joints in thermal cycling tests. In the present investigation, the bare Invar dies without coating were cleaned in the same way as for pure Ni substrate before soldering.

Soldering was conducted in a reflow oven with a peak temperature of 243-248° C. and time above liquidus (TAL) of 50-60 seconds for the Pb-free solder alloys, or with a peak temperature of 335° C. and TAL of about 60 seconds for the standard high-Pb solder alloy (Pb5Sn2.5Ag).

The thermal fatigue resistance of solder joints was evaluated using accelerated temperature cycling tests (TCT). The temperature cycling tests were carried out in the present experiments under a profile of −55° C./200° C. with a dwell time of 5 minutes at each temperature extreme (about 40 minutes per cycle), as well as under a profile of −40° C./175° C. with a dwell time of 5 minutes at each temperature extreme (about 33 minutes per cycle). At different cycle numbers, a set of samples were taken out for die shear testing. The die-attach solder joints were shear tested using a Condor 250 XYZTEC die shear tester at a shear speed of 6 mm per minute, and the remaining shear strengths after various temperature cycles for each alloy were measured in MPa.

For each condition, seven solder joints were shear tested.

The test results for the examples of solder alloys according to the present disclosure and for comparative alloys (the commercial Innolot alloy and the industry standard high-Pb solder alloy Indalloy151) are shown in FIGS. 10-14.

Figure 10:
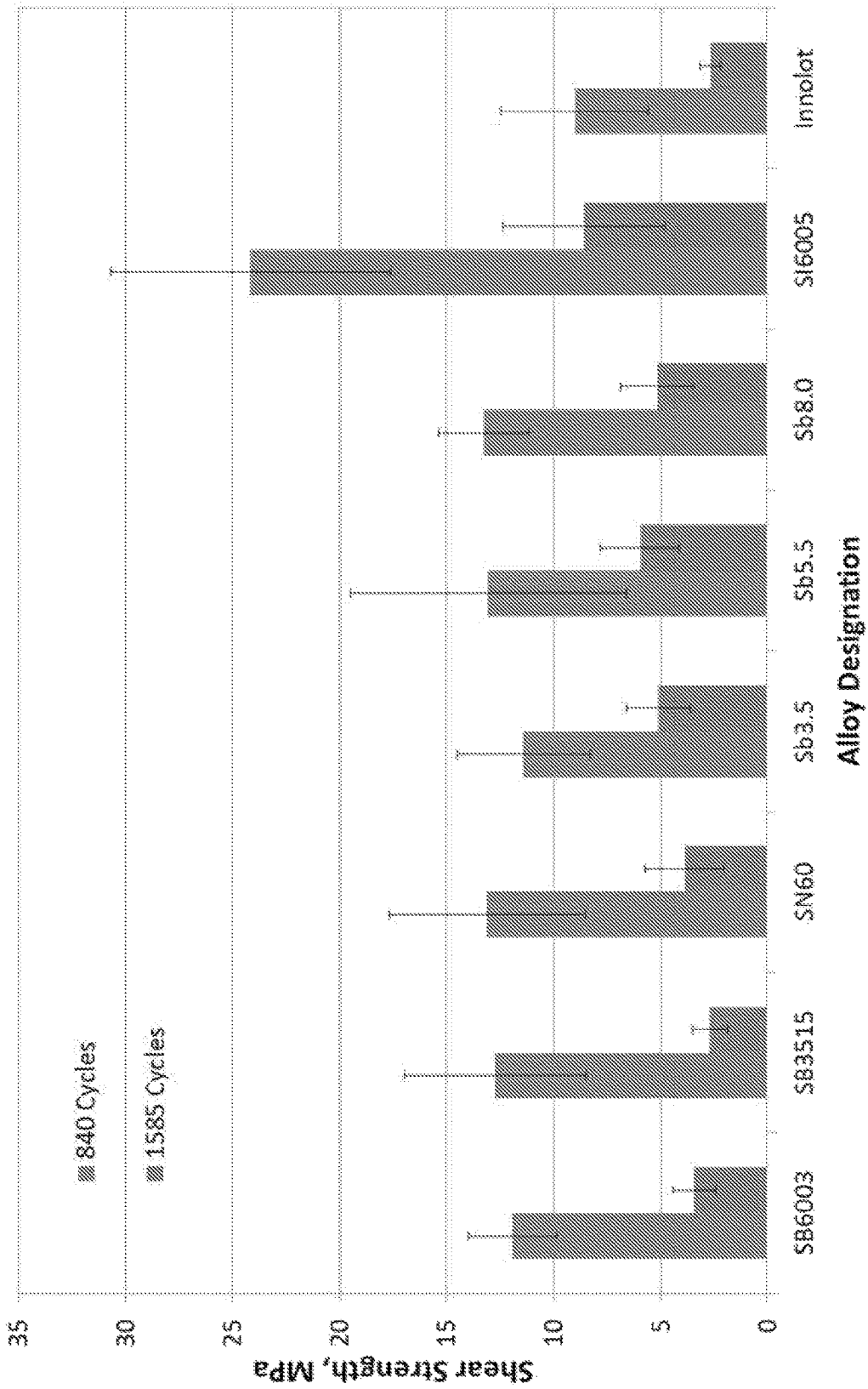
FIG. 10 shows the shear strength variations after 840 and 1585 cycles, respectively, of −55° C./200° C. temperature cycling tests (TCT) for Si die-attach solder joints on a Cu substrate made from selected solder alloys of FIG. 2. Note that for the Sb3.5 and Sb5.5 alloys, shear strengths were tested after 860 and 1607 cycles of TCT, respectively.

FIG. 10 shows the shear strength variations after 840 and 1585 cycles, respectively, of −55° C./200° C. temperature cycling tests (TCT) for Si die-attach solder joints on a Cu substrate made from selected alloys of FIG. 2. Note that for the Sb3.5 and Sb5.5 alloys, shear strengths were tested after 860 and 1607 cycles of TCT, respectively. The higher the remaining strength of a solder joint after TCT, the more reliable it is. It is demonstrated that the shear strength of solder joints decreases with increasing thermal cycles due to increased damage in the solder joints caused by TCT. As shown in FIG. 10, solder joints made from the new exemplary solder alloys exhibit higher average remaining shear strengths than the commercial Innolot solder joint after TCT under these test conditions. The SI6005 alloy with a composition of Sn3.8Ag0.9Cu6.0Sb0.5In more than doubled the performance of the comparative alloy.

Figure 11:
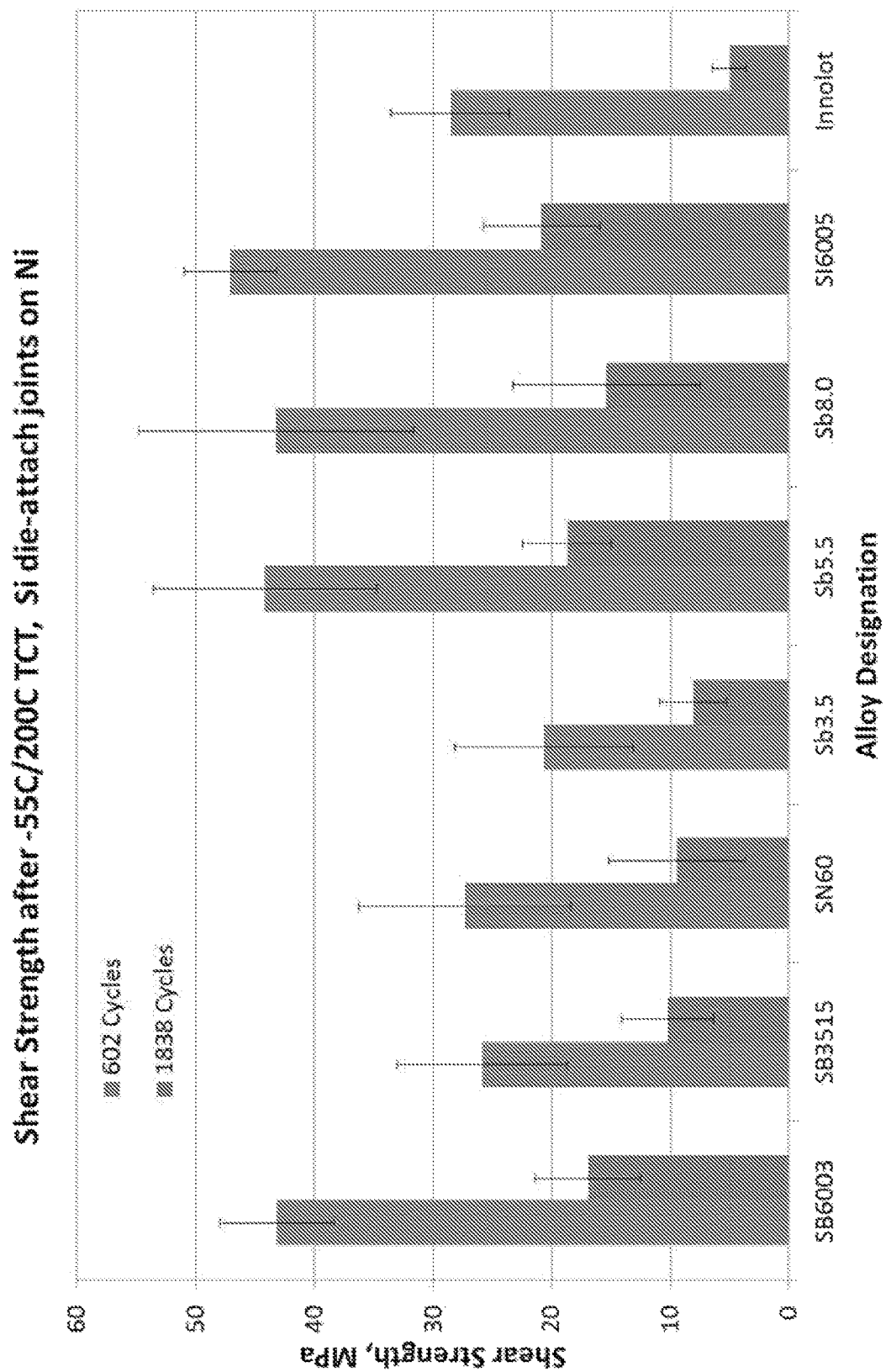
FIG. 11 shows the shear strength variations after 602 and 1838 cycles of −55° C./200° C. TCT for Si die-attach solder joints on Ni substrate made from the same alloys as in FIG. 10.

FIG. 11 shows the shear strength variations after 602 and 1838 cycles of −55° C./200° C. TCT for Si die-attach solder joints on Ni substrate made from the same alloys as in FIG. 10. Generally, the Si die-attach solder joints on Ni substrate have a much higher average remaining shear strength after TCT than their counterparts on Cu substrate. This is due to the fact that the mismatch of coefficient of thermal expansion (CTE) in the solder joints of Ni substrate (with CTE 13 ppm/° C. for Ni vs. ~3 ppm/° C. for Si) is lower than the CTE mismatch in those of Cu substrate (with CTE 17 ppm/° C. for Cu vs. ~3 ppm/° C. for Si). As a result, lower stresses or strains and thus less damage are produced in the solder joints of Ni substrate than in those of Cu substrate during the temperature cycling tests. As illustrated in FIG. 11, all solder joints on Ni made from the exemplary solder alloys exhibit higher average shear strengths than the comparative Innolot solder joint after TCT under these test conditions. The SI6005, SB6003 (with a nominal composition of Sn3.8Ag1.0Cu6.0Sb0.3Bi), and Sb5.5 (with a nominal composition of Sn3.8Ag1.0Cu5.5Sb) were the three best performers in these tests.

Figure 12:
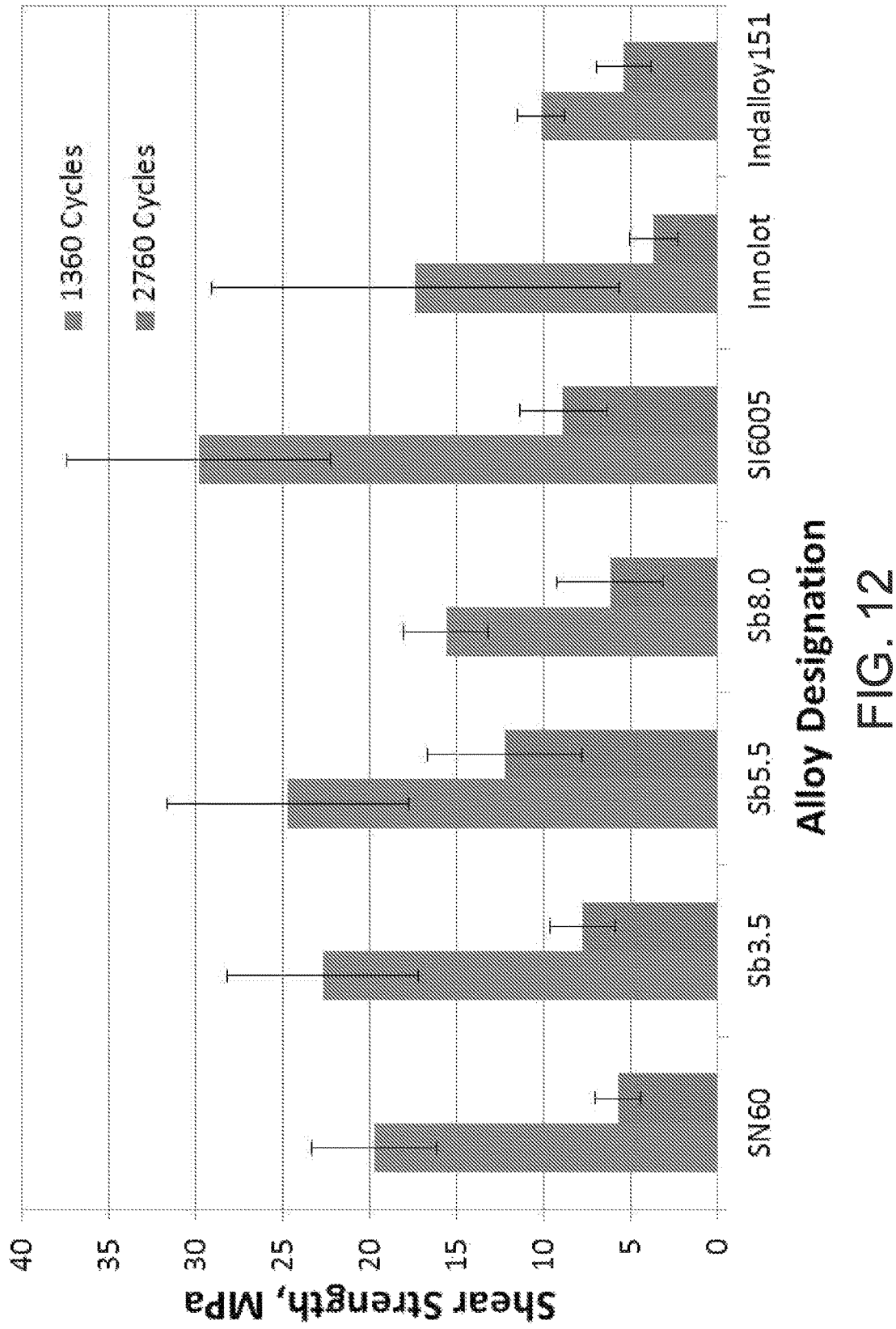
FIG. 12 shows the shear strength results after 1360 and 2760 cycles, respectively, of −40° C./175° C. TCT for Si die-attach solder joints on Cu substrate made from solder alloys in FIG. 2 as well as a comparative high-Pb standard alloy.

FIG. 12 shows the shear strength results after 1360 and 2760 cycles, respectively, of −40° C./175° C. TCT for Si die-attach solder joints on Cu substrate made from exemplary solder alloys as well as from the comparative alloys (the Innolot alloy and the Indalloy151 high-Pb standard alloy). As illustrated in FIG. 12, under these test conditions, all solder joints on Cu made from the exemplary solder alloys exhibit higher average shear strengths after TCT not only than the comparative Pb-free Innolot solder joint, but also than the comparative high-Pb Indalloy151 solder joint.

Figure 13:
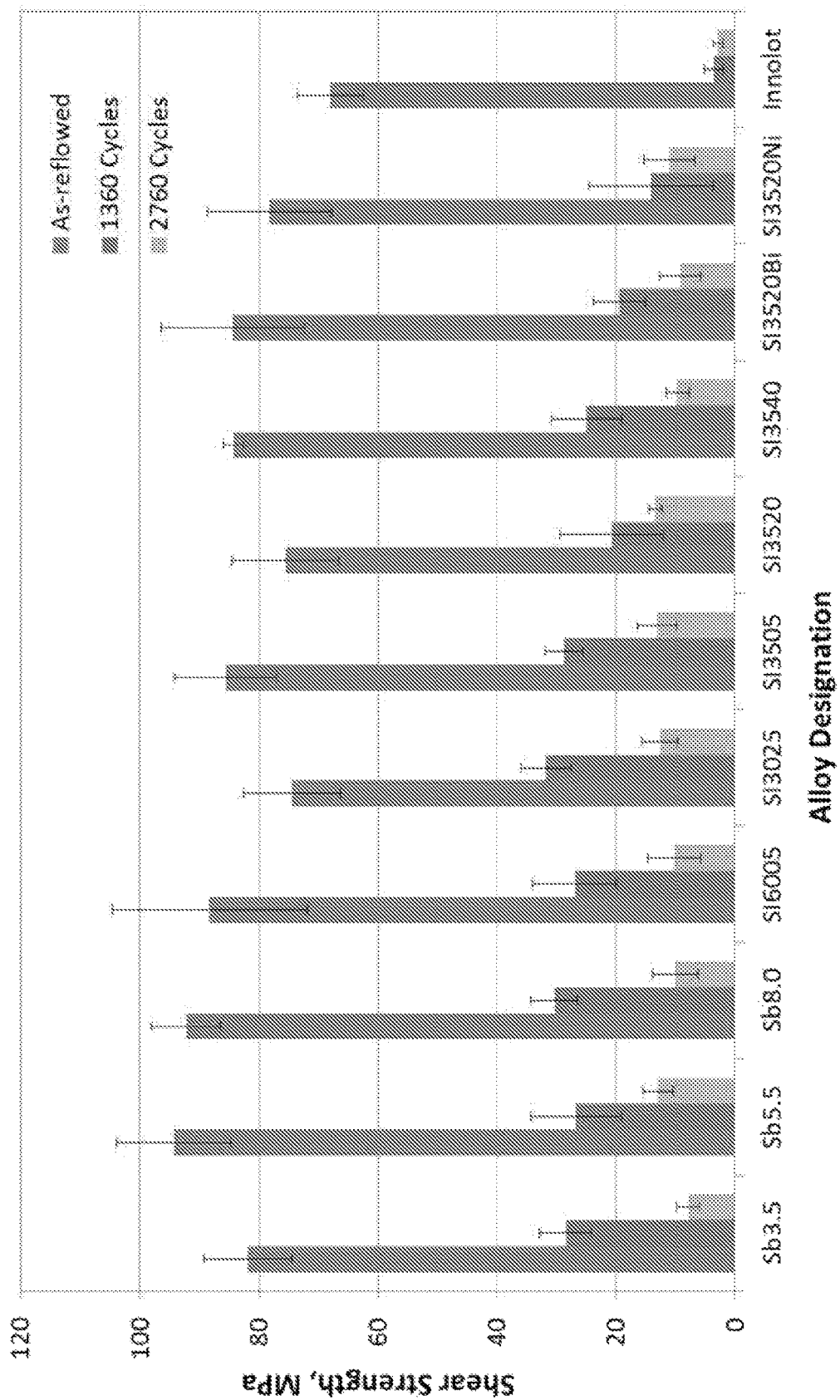
FIG. 13 shows the shear strength results for the as-reflowed condition, after 1360 and 2760 cycles, respectively, of −40° C./175° C. TCT for Invar die-attach solder joints on Cu substrate made from solder alloys in FIG. 2.

FIG. 13 shows the shear strength results for the as-reflowed condition, after 1360 and 2760 cycles, respectively, of −40° C./175° C. TCT for Invar die-attach solder joints on Cu substrate made from exemplary solder alloys in FIG. 2 as well as from the comparative Innolot alloy. The Indalloy151 high-Pb solder alloy was not included in the evaluation as a comparative alloy because the solder joints made with the bare Invar die were weak due to the poor wetting of the high-Pb solder on the Invar alloy. As mentioned previously, one of the advantages in using the Invar dies for making the metal die-attach solder joints is to be able to measure the as-reflowed solder joints shear strengths. As illustrated in FIG. 13, the as-reflowed solder joints on Cu substrate made from the exemplary solder alloys have very high average shear strengths, ranging from 76 to 94 MPa, as compared to 68 MPa for the comparative Innolot solder joint. After 1360 and 2760 cycles of −40° C./175° C. TCT, the average shear strengths of solder joints decrease significantly, but those of solder joints made from the exemplary solder alloys are much higher than the Innolot solder joints shear strength.

Figure 14:
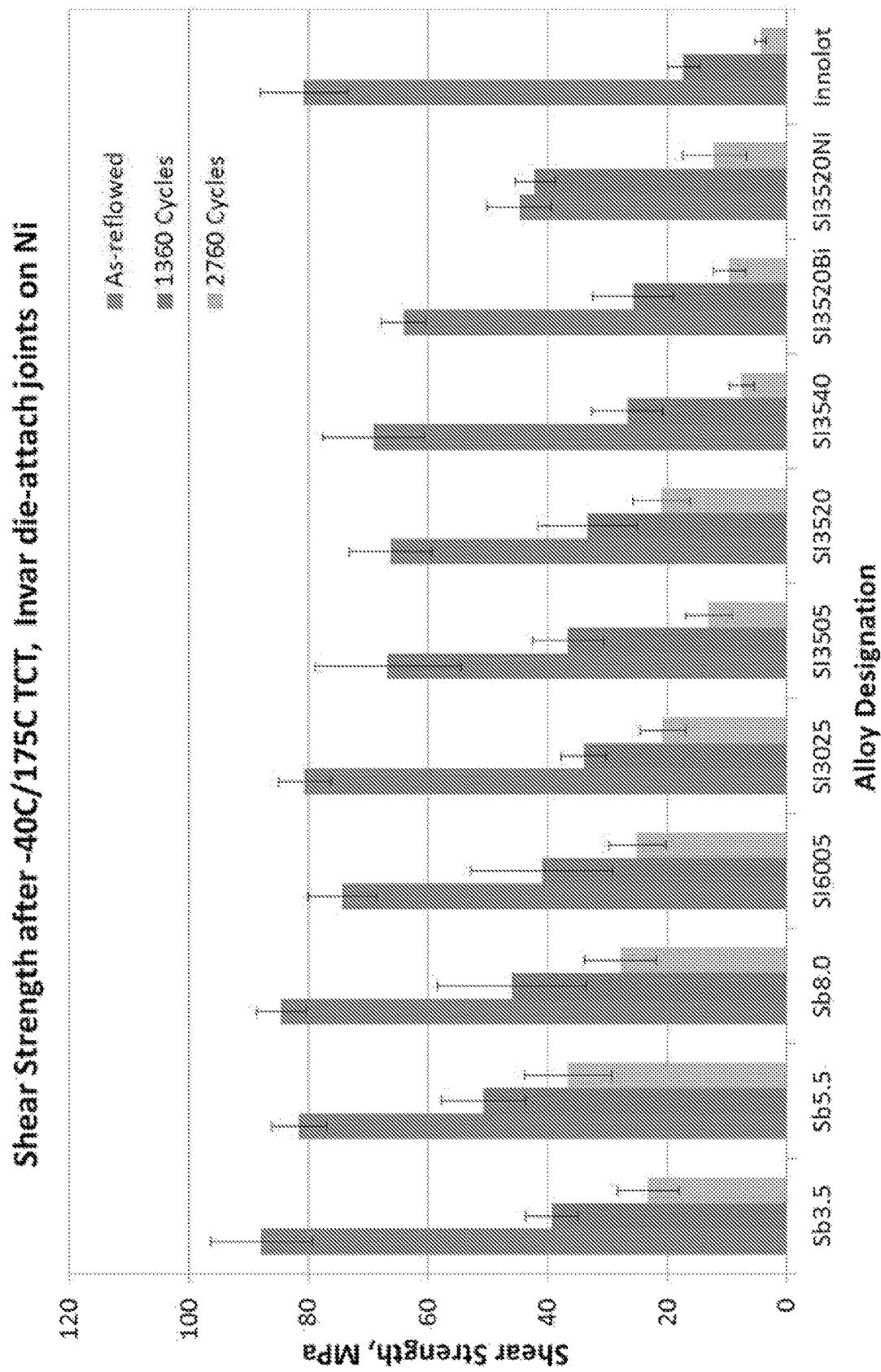
FIG. 14 shows the shear strength results for the as-reflowed condition, after 1360 and 2760 cycles, respectively, of −40° C./175° C. TCT for Invar die-attach solder joints on Ni substrate made from the same alloys as in FIG. 13.

FIG. 14 shows the shear strength results for the as-reflowed condition, after 1360 and 2760 cycles, respectively, of −40° C./175° C. TCT for Invar die-attach solder joints on Ni substrate made from the same alloys as in FIG. 13. Generally, the as-reflowed Invar die-attach solder joints on Ni substrate have a similar average shear strength to their counterparts on Cu substrate. However, the decrease rates of the shear strengths are considerably reduced after TCT for the Invar die-attach solder joints on Ni substrate, as compared to their counterparts on Cu substrate. As illustrated in FIG. 14, after TCT under these test conditions, all Invar die-attach joints on Ni made from the exemplary solder alloys exhibit not only higher average shear strengths, but also much reduced decrease rates of shear strengths from the as-reflowed condition, than the comparative Innolot solder joint.

Figure 15:
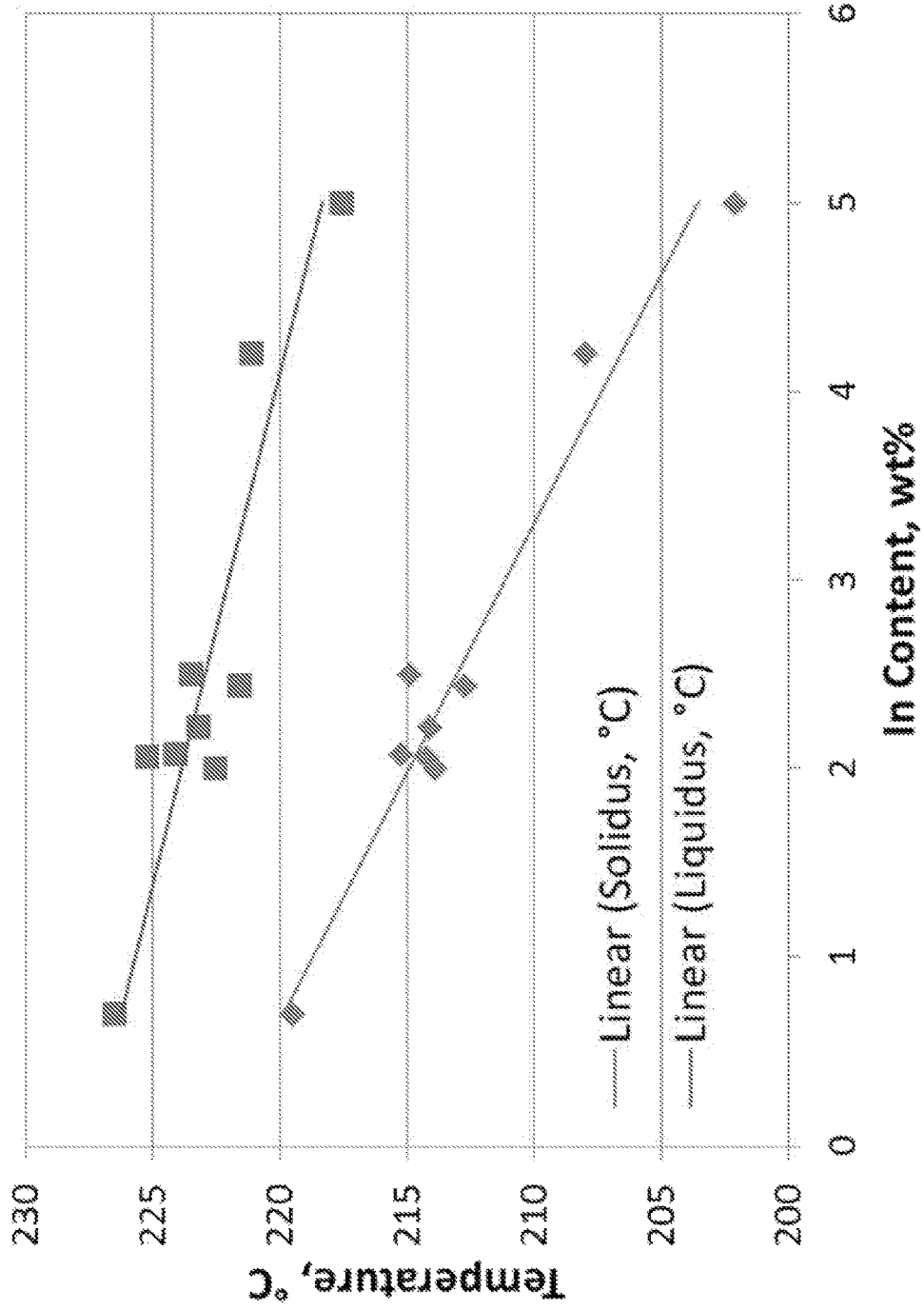
FIG. 15 shows the variations of solidus and liquidus temperatures with In contents in Sn(3.2-3.8)Ag(0.7-0.9)Cu(3.0-4.0)SbxIn alloys according to the present disclosure.

FIG. 15 shows the variations of solidus and liquidus temperatures with In contents in Sn(3.2-3.8)Ag(0.7-0.9)Cu(3.0-4.0)SbxIn alloys according to the present disclosure. As the In concentration increases, both the solidus and liquidus temperatures are reduced. Thus, the addition of In to the SnAgCuSb alloys can effectively decrease the melting temperature of the alloy. As the In concentration increases, the melting temperature range (between solidus and liquidus) also becomes wider. For soldering performance considerations, a narrow melting temperature range less than 15° C. is desired, the In addition should be no more than 5 wt %.

Figure 16:
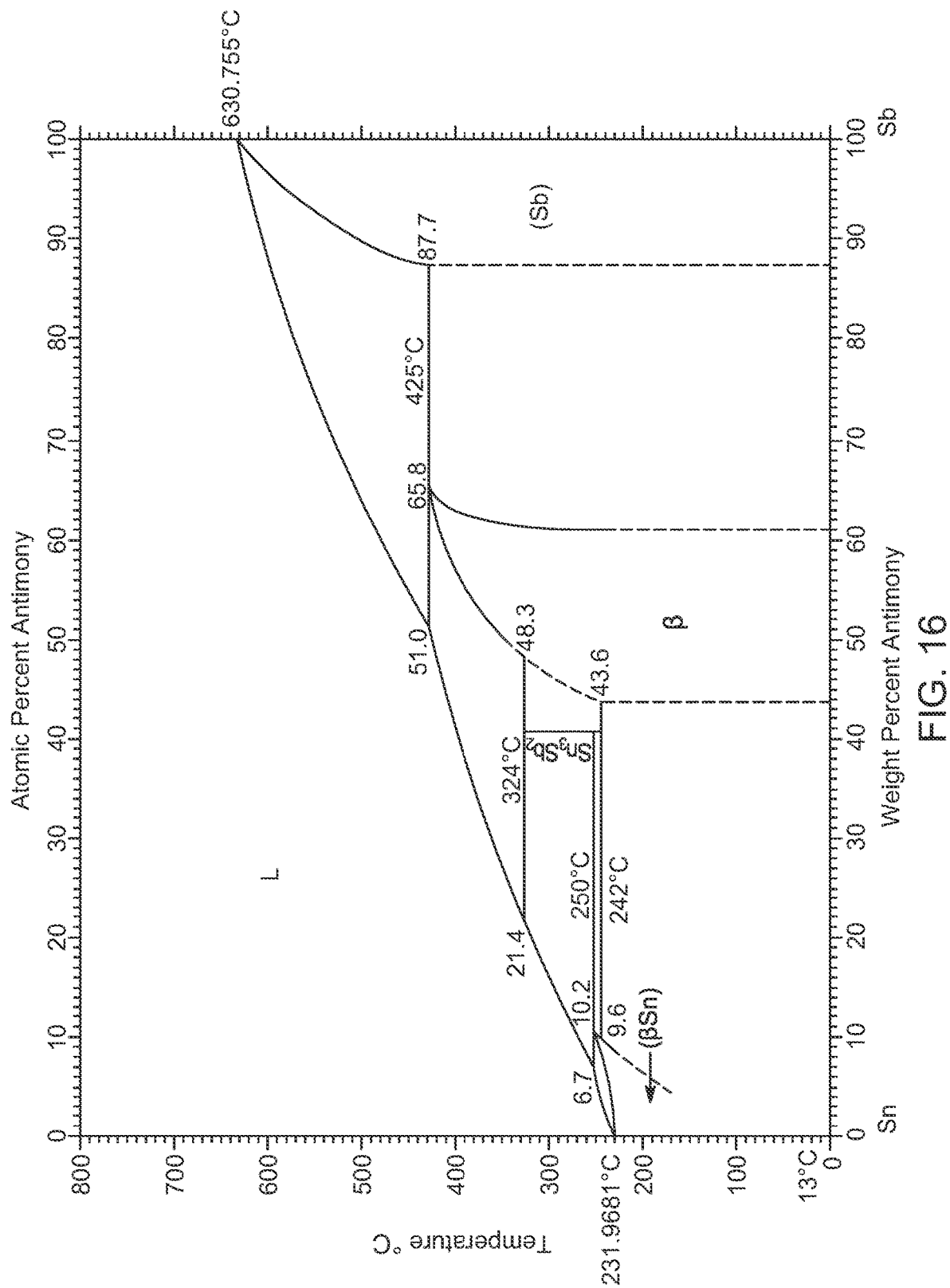
FIG. 16 shows a Sn—Sb binary phase diagram.

FIG. 16 shows a Sn—Sb binary phase diagram. Based on the equilibrium phase diagram, a Sn(Sb) solid solution forms after solidification of a Sn—Sb alloy of less than 10.2 wt % Sb. Upon subsequent cooling the SnSb intermetallic phase is precipitated from the supersaturated Sn(Sb) solid solution (>3 wt % Sb). The P—SnSb phase is a quasicubic NaCl (B1) face-centered cubic (FCC) type. This structure contains one sublattice of Sb atoms and another sublattice of Sn atoms, with each Sn atom being surrounded by six Sb first neighbors and each Sb atom by six Sn first neighbors. Since its compositions vary within a rather wide range, this type of intermetallic phases tends to be moderately ductile and thus have a benign effect on joint properties. Thus, the addition of Sb>3 wt % can provide both solid-solution and precipitate strengthening to the SnAgCu base alloy. For a Sn—Sb alloy with Sb content between 6.7 wt % and 10.2 wt %, a primary solidification phase of $Sn_3Sb_2$ forms initially, and converts into the Sn(Sb) solid solution via a peritectic reaction at 250° C., as shown in the Sn—Sb binary phase diagram. However, in a non-equilibrium solidification condition like the soldering process, this $Sn_3Sb_2$ phase conversion cannot be complete, and the coarse primary intermetallic phase tends to be brittle. Thus, the Sb content in the alloys according to the present disclosure is preferred to be below about 9 wt %.

Benefits of the Compositional Ranges of Alloys of the Present Disclosure

The benefits of the compositional range of alloys disclosed herein are described below. In the Sn—Ag—Cu alloy system, the ternary eutectic composition is approximately Sn3.7Ag0.9Cu, with a eutectic temperature of 217° C. Ag is a major strengthening element in the alloy by forming the $Ag_3Sn$ intermetallic particles to act as dispersion strengthening phases. Ag also improves the wettability of solder alloys. For comprehensive considerations of alloys melting behavior, wetting, mechanical properties and thermal cycling reliability, the Ag content is preferred to be in the range of 2.5-4.5 wt %. When Ag is less than 2.5 wt %, mechanical properties and thermal cycling reliability performance of solder joints are not good enough for harsh environment electronics applications. When Ag is more than 4.5 wt %, the alloy's liquidus temperature is increased significantly, and soldering performance is adversely affected. In addition, the cost increase with higher Ag contents is not desired. Accordingly, in embodiments the Ag content is preferably in the range of 3.0-4.0 wt %.

As one of the major elements constituting the SnAgCuSb base alloy, Cu improves the alloy's mechanical properties by the formation of $Cu_6Sn_5$ intermetallic particles in the solder matrix. It also greatly reduces the dissolution of Cu substrate metal or Cu pads. Based on observations of solder joint microstructure, it was found by the inventors that a higher Cu content in the solder can improve the reliability of solder joints especially with Ni substrate metal or surface finishes by promoting and stabilizing a $(Cu,Ni)_6Sn_5$ intermetallic layer structure and preventing the $(Cu,Ni)_6Sn_5/(Cu,Ni)_3Sn_4$ dual layer structure from formation at the solder joint interfaces. Furthermore, a higher Cu content in the solder can also suppress the occurrences of $Ag_3Sn$ plates in solder joints with high Ag content (3 wt % or higher) by initiating the $Cu_6Sn_5$ primary solidification instead of the $Ag_3Sn$ primary solidification phase formation. When Cu is less than 0.6 wt %, the above-mentioned beneficial effects are not expected to be utilized. When Cu is more than 2.0 wt %, the alloys liquidus temperature becomes too high and the melting temperature range becomes too wide for reflow soldering, which affects the soldering performance adversely (e.g., increased voiding). In embodiments of the present disclosure, the Cu content is preferably in the range of 0.6-1.2 wt %.

In the present disclosure, Sb is found to be a key element improving the thermal fatigue resistance of solder joints made of the disclosed alloys in very severe thermal cycling or thermal shock testing conditions used in the present investigations. When the Sb content is less than 2.5 wt %, Sb is dissolved in the Sn matrix to form a Sn(Sb) solid solution as well as in the $Ag_3Sn$ phase. As mentioned previously, with the addition of Sb>3 wt % in the solder alloys, the P—SnSb (FIG. 16) intermetallic phase is precipitated from the supersaturated Sn(Sb) solid solution, providing both solid-solution and precipitation strengthening to the SnAgCu alloy. Due to the characteristics and benign effects of the P—SnSb intermetallic precipitation strengthening mechanism, the SnAgCuSb alloys according to the present disclosure exhibit superior comprehensive mechanical properties (both high strength and high ductility), as shown in FIG. 8, as well as greatly improved solder joint reliability performance. However, the addition of Sb increases both the solidus and liquidus temperatures of the alloy. Furthermore, based on previous analyses, in order to avoid the complication of a coarse and brittle primary solidification phase of $Sn_3Sb_2$, the Sb content according to the present disclosure should be below about 9 wt %. Sb content is more preferably in the range of 3.0-8.0 wt %. Based on the reliability test results in the present investigations, an optimum Sb content is about 5-6 wt % for SnAgCuSb alloys.

As additives to the SnAgCuSb alloys, both Bi and In can decrease the solidus and liquidus temperatures of the alloy. Bi also reduces the surface tension of liquid solders, and thus improves the alloys wettability. Unlike Sb, when Bi is more than 2.5 wt %, the Bi addition increases the alloys strengths, but reduces its ductility significantly, making solder joints brittle with decreased thermal fatigue resistance. In embodiments of the present disclosure, a Bi addition of 1.5 wt % or below is preferred for harsh environment electronics applications.

In addition to the beneficial effects of reducing the solidus and liquidus temperatures of the alloy, when In is added to the SnAgCuSb alloys in less than 4.5 wt %, In is mostly dissolved in the P—Sn matrix to provide a solid-solution strengthening effect. Thus, the alloys mechanical properties and solder joints thermal cycling reliability performance are further improved. Based on microstructure observations of solder joints subjected to severe temperature cycling tests, it was found by the inventors that In additions to the SnAg-CuSb alloys can also strengthen grain boundaries and suppress the grain boundary damages at high temperatures, and delay the recrystallization process of solder joints during temperature cycling testing. As discussed previously, when In content is 5 wt % or higher, the alloys melting temperature range is larger than 15° C. In is also an alloying element prone to oxidation, especially in the form of fine solder powder for solder paste applications. It was found by the inventors that soldering performance is decreased (e.g., reduced wetting and increased voiding) with alloys of In additions higher than 4.5 wt %. Thus, In addition of 4.5 wt % or below is generally preferred in the present disclosure. A preferred In content in the alloy also depends on the Sb content. When Sb content is higher than 5.0 wt %, the In addition is preferred to be less than 3.0 wt % to avoid incipient melting phases in the alloy.

In the present disclosure, an amount of 0.001-0.2 wt. % of Ni, or Co, or both can be added to further improve the alloy's mechanical properties and solder joint reliability performance. When the total amount is higher than 0.2 wt %, the alloy's liquidus temperature is increased excessively. In addition, these elements are also prone to oxidation, and thus adversely affect soldering performance when the total addition is more than 0.2 wt %, especially in the form of fine solder powder for solder paste applications. Thus, the upper limit for these additions is 0.2 wt %.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all conFIG.d in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A solder alloy consisting of: 3.0-4.0 wt. % of Ag; 0.6-1.2 wt. % of Cu; 3.0-5.0 wt. % of Sb; 1.0-4.0 wt. % of In; about 0.5 wt. % of Bi, and a remainder of Sn, wherein:
   the solder alloy is a solder alloy powder, a solder ball, or a solder preform, and
   a melting temperature range between a solidus temperature and a liquidus temperature of the solder alloy is less than 15° C.

2. The solder alloy of claim 1, wherein the solder alloy is the solder alloy powder.

3. The solder alloy of claim 1, wherein the solder alloy is the solder ball.

4. The solder alloy of claim 1, wherein the solder alloy is the solder preform.

5. The solder alloy of claim 1, wherein the solidus temperature is between 208.0° C. and 223.3° C., and the liquidus temperature is between 221.1° C. and 231.7° C.

6. The solder alloy of claim 5, wherein the solidus temperature is between 210° C. and 220° C.

7. The solder alloy claim 6, wherein the solidus temperature is about 213° C., and the liquidus temperature is about 227° C.

8. A solder paste, comprising:
   flux; and
   a solder alloy powder consisting of 3.0-4.0 wt. % of Ag; 0.6-1.2 wt. % of Cu; 3.0-5.0 wt. % of Sb; 1.0-4.0 wt. % of In; about 0.5 wt. % of Bi, and a remainder of Sn, wherein a melting temperature range between a solidus temperature and a liquidus temperature of the solder alloy powder is less than 15° C.

9. The solder paste of claim 8, wherein the solidus temperature is between 208.0° C. and 223.3° C., and the liquidus temperature is between 221.1° C. and 231.7° C.

10. The solder paste of claim 9, wherein the solidus temperature is between 210° C. and 220° C.

11. The solder paste claim 10, wherein the solidus temperature is about 213° C., and the liquidus temperature is about 227° C.

12. A solder alloy consisting of: about 3.26 wt. % of Ag, about 0.74 wt. % of Cu, about 3.55 wt. % of Sb, about 0.45 wt. % of Bi, about 2.22 wt. % of In, and a remainder of Sn, wherein: the solidus temperature is about 214.1° C., and the liquidus temperature is about 223.2° C.

* * * * *